US008180063B2

(12) United States Patent
Henderson

(10) Patent No.: US 8,180,063 B2
(45) Date of Patent: May 15, 2012

(54) AUDIO SIGNAL PROCESSING SYSTEM FOR LIVE MUSIC PERFORMANCE

(75) Inventor: William Henderson, Orono, MN (US)

(73) Assignee: Audiofile Engineering LLC, Minneapolis, MN (US)

( * ) Notice: Subject to any disclaimer, the term of this patent is extended or adjusted under 35 U.S.C. 154(b) by 993 days.

(21) Appl. No.: 12/055,903

(22) Filed: Mar. 26, 2008

(65) Prior Publication Data

US 2008/0240454 A1 Oct. 2, 2008

Related U.S. Application Data

(60) Provisional application No. 60/921,154, filed on Mar. 30, 2007.

(51) Int. Cl.
*H03G 99/00* (2006.01)

(52) U.S. Cl. ............................... 381/61; 381/62; 381/66

(58) Field of Classification Search ............. 381/61–62, 381/66

See application file for complete search history.

(56) References Cited

U.S. PATENT DOCUMENTS

| | | | | |
|---|---|---|---|---|
| 4,597,318 | A | 7/1986 | Nikaido et al. | |
| 4,961,364 | A | 10/1990 | Tsutsumi et al. | |
| 5,092,216 | A * | 3/1992 | Wadhams | 84/602 |
| 5,225,618 | A * | 7/1993 | Wadhams | 84/602 |
| 5,331,111 | A | 7/1994 | O'Connell | |
| 5,376,752 | A * | 12/1994 | Limberis et al. | 84/622 |
| 5,393,926 | A | 2/1995 | Johnson | |
| 5,508,469 | A | 4/1996 | Kunimoto et al. | |

(Continued)

FOREIGN PATENT DOCUMENTS

WO WO 99-37032 7/1999

(Continued)

OTHER PUBLICATIONS

Sasso, Audiofile Engineering Wave Editor 1.2.1 (Mac). Electronic Musician. Jul. 1, 2006, 2 pages.

(Continued)

*Primary Examiner* — Laura Menz

(74) *Attorney, Agent, or Firm* — Patterson Thuente Christensen Pedersen, P.A.

(57) ABSTRACT

A method for generating and/or performing music in real time includes receiving one or more audio signals, receiving one or more virtual instrument trigger signals, and selecting one or more plug-ins and/or one or more virtual instruments. A processing scheme is selected from a set of operations. The received audio signals and instrument trigger signals are processed in real time as a function of the selected plug-ins, virtual instruments and processing scheme, and outputted in real time as music signals. The set of operations from which the processing scheme can be selected includes: (1) manipulating the received audio signals as a function of the selected sound effects plug-ins to produce manipulated audio signals, and/or (2) generating virtual instrument sound signals as a function of the received trigger signals and the selected virtual instruments, and/or (3) manipulating the virtual instrument sound signals as a function of the selected sound effect plug-ins to produce manipulated virtual instrument signals, and/or (4) combining the received audio signals and/or the manipulated audio signals and/or the virtual instrument sound signals and/or the manipulated virtual instrument signals to produce combined signals, and/or (5) manipulating any or all of the combined signals to produce manipulated combined signals, and/or (6) repeating operations (4) and/or (5) with any or all of the combined signals and/or with any or all of the manipulated combined signals to produce iteratively processed signals.

4 Claims, 3 Drawing Sheets

U.S. PATENT DOCUMENTS

| | | | | |
|---|---|---|---|---|
| 5,511,000 | A * | 4/1996 | Kaloi et al. | 704/201 |
| 5,542,000 | A | 7/1996 | Semba | |
| 5,569,869 | A | 10/1996 | Sone | |
| 5,602,358 | A | 2/1997 | Yamamoto et al. | |
| 5,663,517 | A | 9/1997 | Oppenheim | |
| 5,698,802 | A | 12/1997 | Kamiya | |
| 5,714,703 | A | 2/1998 | Wachi et al. | |
| 5,740,260 | A * | 4/1998 | Odom | 381/119 |
| 5,741,991 | A | 4/1998 | Kurata | |
| 5,741,992 | A | 4/1998 | Nagata | |
| 5,781,188 | A | 7/1998 | Amiot et al. | |
| 5,848,164 | A | 12/1998 | Levine | |
| 5,850,628 | A * | 12/1998 | Jeffway, Jr. | 704/258 |
| 5,895,877 | A * | 4/1999 | Tamura | 84/625 |
| 5,913,258 | A * | 6/1999 | Tamura | 84/604 |
| 5,928,342 | A | 7/1999 | Rossum et al. | |
| 5,930,158 | A | 7/1999 | Hoge | |
| 5,952,597 | A | 9/1999 | Weinstock et al. | |
| 5,981,860 | A | 11/1999 | Isozaki et al. | |
| 5,986,199 | A * | 11/1999 | Peevers | 84/603 |
| 6,018,709 | A * | 1/2000 | Jeffway, Jr. | 704/258 |
| 6,087,578 | A | 7/2000 | Kay | |
| 6,103,964 | A | 8/2000 | Kay | |
| 6,137,044 | A | 10/2000 | Guilmette et al. | |
| 6,140,566 | A * | 10/2000 | Tamura | 84/609 |
| 6,184,455 | B1 * | 2/2001 | Tamura | 84/625 |
| 6,281,830 | B1 | 8/2001 | Flety | |
| 6,327,367 | B1 | 12/2001 | Vercoe et al. | |
| 6,380,474 | B2 | 4/2002 | Taruguchi et al. | |
| 6,410,837 | B2 | 6/2002 | Tsutsumi | |
| 6,490,359 | B1 | 12/2002 | Gibson | |
| 6,664,460 | B1 | 12/2003 | Pennock et al. | |
| 6,757,573 | B1 | 6/2004 | Ledoux et al. | |
| 6,816,833 | B1 | 11/2004 | Iwamoto et al. | |
| 6,839,441 | B1 | 1/2005 | Powers et al. | |
| 6,888,999 | B2 | 5/2005 | Herberger et al. | |
| 6,924,425 | B2 | 8/2005 | Naples et al. | |
| 6,931,134 | B1 | 8/2005 | Waller, Jr. et al. | |
| 6,967,275 | B2 | 11/2005 | Ozick | |
| 6,969,798 | B2 | 11/2005 | Iwase | |
| 7,096,080 | B2 | 8/2006 | Asada et al. | |
| 7,102,069 | B2 * | 9/2006 | Georges | 84/609 |
| 7,107,110 | B2 | 9/2006 | Fay et al. | |
| 7,119,267 | B2 * | 10/2006 | Hirade et al. | 84/602 |
| 7,257,230 | B2 * | 8/2007 | Nagatani | 381/56 |
| 7,314,994 | B2 * | 1/2008 | Hull et al. | 84/645 |
| 7,678,985 | B2 * | 3/2010 | Adams et al. | 84/645 |
| 7,847,178 | B2 * | 12/2010 | Georges | 84/645 |
| 7,916,060 | B2 * | 3/2011 | Zhu et al. | 341/155 |
| 2002/0134221 | A1 * | 9/2002 | Georges | 84/609 |
| 2003/0024375 | A1 | 2/2003 | Sitrick | |
| 2004/0016338 | A1 | 1/2004 | Dobies | |
| 2004/0030425 | A1 | 2/2004 | Yeakel et al. | |
| 2004/0031379 | A1 * | 2/2004 | Georges | 84/625 |
| 2004/0069121 | A1 * | 4/2004 | Georges | 84/609 |
| 2004/0074377 | A1 * | 4/2004 | Georges | 84/609 |
| 2004/0220814 | A1 | 11/2004 | Rudolph | |
| 2004/0264715 | A1 | 12/2004 | Lu et al. | |
| 2005/0005760 | A1 * | 1/2005 | Hull et al. | 84/645 |
| 2005/0038922 | A1 | 2/2005 | Yamamoto et al. | |
| 2006/0015196 | A1 | 1/2006 | Hiipakka et al. | |
| 2006/0032362 | A1 | 2/2006 | Reynolds et al. | |
| 2006/0072771 | A1 | 4/2006 | Kloiber et al. | |
| 2006/0090631 | A1 | 5/2006 | Ohno | |
| 2006/0159291 | A1 | 7/2006 | Fliegler et al. | |
| 2006/0248173 | A1 | 11/2006 | Shimizu | |
| 2007/0098368 | A1 | 5/2007 | Carley et al. | |
| 2007/0131100 | A1 * | 6/2007 | Daniel | 84/737 |
| 2007/0227342 | A1 | 10/2007 | Ide et al. | |
| 2008/0041220 | A1 | 2/2008 | Foust et al. | |
| 2008/0130906 | A1 * | 6/2008 | Goldstein et al. | 381/58 |
| 2008/0240454 | A1 * | 10/2008 | Henderson | 381/61 |
| 2009/0055007 | A1 * | 2/2009 | Grigsby et al. | 700/94 |
| 2011/0058687 | A1 * | 3/2011 | Niemisto et al. | 381/99 |
| 2011/0064233 | A1 * | 3/2011 | Van Buskirk | 381/61 |
| 2011/0197741 | A1 * | 8/2011 | Georges | 84/645 |

FOREIGN PATENT DOCUMENTS

| | | |
|---|---|---|
| WO | WO 2004-025306 | 3/2004 |
| WO | WO 2007-009177 | 1/2007 |

OTHER PUBLICATIONS

M-Audio GuitarBox Pro, web brochure, printed Feb. 8, 2007, 3 pages.

Musiciansnews.com, Gibson Les Paul HD.6X-PRO Digital Guital report, printed Nov. 30, 2006, web pages 1-2.

Sweetwater.com, 121st AES Convention Show reports, printed Nov. 30, 2006, web pages 1-10.

Digidesign Venue, brochure, Dec. 2004, 24 pages.

“Upgraded Plugzilla Offers 8 Channel Lower Price”, Press Release dated Oct. 28, 2004, 3 pages.

“Rackmount Your VST Plug-Ins with Plugzilla”, Press Release dated Oct. 7, 2002, 4 pages.

“Device Profile: Manifold Labs Plugzilla Audio Processor”, Press Release dated Feb. 1, 2005, 4 pages.

International Search Report and Written Opinion for PCT/US2008/058262, 9 pages.

* cited by examiner

AUDIO SIGNAL PROCESSING SYSTEM FOR LIVE MUSIC PERFORMANCE

REFERENCE TO RELATED APPLICATION

This application claims the benefit of U.S. Provisional Application Ser. No. 60/921,154, filed on Mar. 30, 2007, and entitled Audio Signal Processing System For Live Music Performance, which is incorporated herein by reference in its entirety.

FIELD OF THE INVENTION

The invention is an electronic system for processing audio signals such as those produced by an instrument or a vocalist through a microphone during live music performances in an effectively infinite variety of ways.

BACKGROUND OF THE INVENTION

Musicians and vocalists have a wide range of audio signal processing systems available to them during recording sessions. One system widely used in professional recording studios is a workstation with Digidesign's ProTools audio mixer software. These workstations include a wide variety of software sound effects libraries, sampling sequences and other so-called "plug-ins" that can be used to manipulate the audio instrument or vocal source. They also include virtual instrument and vocal libraries that can be "played" and recorded in response to signals (e.g., Musical Instrument Digital Interface (MIDI) trigger signals) inputted into the workstation. Using a "celebrity" guitarist sound effect library, for example, the workstation can manipulate any inputted guitar signal in such a manner as to have the signature sounds of that celebrity guitarist. The sound of vocalists can be enhanced by manipulating dynamics, correcting pitch or by injecting reverberation or digital delay to mask undesirable vocal characteristics, or to enhance appealing ones. Instrument libraries include the notes and other sound features of virtually all commonly used instruments. Using any MIDI-compatible source such as a keyboard, drum pad or stringed instrument, a musician can "play" and record music with any of these instruments. Systems of these types are, however, very complex and require extensive training to be used effectively. They are also relatively expensive. For these reasons they are not suitable for use during live musical and/or vocal performances.

Audio sound manipulation systems used for live performances are also available, although these systems generally offer relatively limited functionality. Guitarists, for example, commonly use effects pedals or stomp boxes to manipulate the sound of their guitars during live performances. Stomp boxes are special-purpose audio processors connected between the guitar and amplifier that manipulate the clean guitar signal in predetermined manners. Distortion, fuzz, reverberation, and wah-wah are examples of the effects that can be added to the signal produced by the guitar itself before it is amplified and played to the listeners through speakers during a performance. A number of different stomp boxes can be chained together to provide the guitarist the ability to effect the sound in many different ways.

An effects processor that has the capability of providing greater varieties of plug-ins for live performances is the Plugzilla audio processor available from Manifold Labs. Audio sources interface to the Plugzilla processor through a conventional mixer. The functionality of this processor is, however, relatively limited, and it can be difficult to operate.

There remains a need for improved audio signal processing systems suitable for use with live performances. Such a system should be capable of providing a large variety of sound manipulation functions. The system should be relatively easy to use and operate. To be commercially viable, it should also be relatively inexpensive.

SUMMARY OF THE INVENTION

The invention is an improved signal processing system for generating and/or manipulating sound in real time. The system includes one or more audio inputs for receiving audio signals, one or more trigger inputs for receiving virtual instrument trigger signals, and memory for storing sound effects plug-ins and libraries of virtual instruments. A graphical user interface enables a musician to select one or more of the sound effects plug-ins and/or virtual instruments from the memory. A digital processor coupled to the audio inputs, trigger inputs, memory and user interface processes the signals in real time. Music signals produced by the processor are outputted in real time through one or more audio outputs. Functions that can be provided by the processor include: (1) manipulating the received audio signals as a function of the selected sound effects plug-ins to produce manipulated audio signals, and/or (2) generating virtual instrument sound signals as a function of the received trigger signals and the selected virtual instruments and/or (3) manipulating the virtual instrument sound signals as a function of the selected sound effect plug-ins to produce manipulated virtual instrument signals, and/or (4) combining the received audio signals and/or the manipulated audio signals and/or the virtual instrument sound signals and/or the manipulated virtual instrument signals to produce combined signals, and/or (5) manipulating any or all of the combined signals to produce manipulated combined signals, and/or (6) repeating operations (4) and/or (5) with any or all of the combined signals and/or with any or all of the manipulated combined signals to produce iteratively processed signals, and (7) producing in real time as one or more output music signals the received audio signals and/or the manipulated audio signals and/or the virtual instrument signals and/or the manipulated virtual instrument signals and/or the combined signals and/or the manipulated combined signals and/or the iteratively processed signals.

DETAILED DESCRIPTION OF THE PREFERRED EMBODIMENTS

Figure 1:
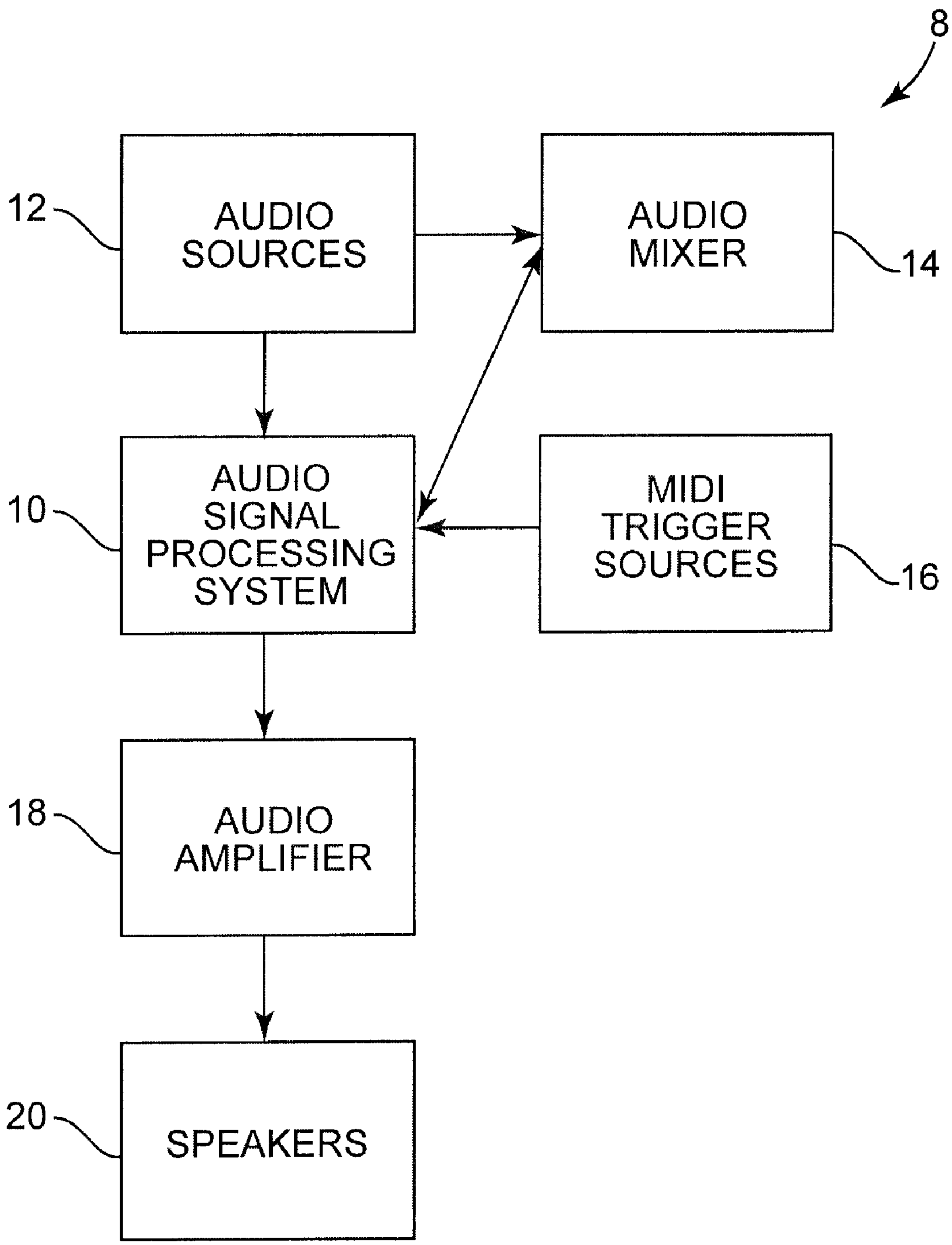
FIG. 1 is a block diagram of a live music performance system including an audio signal processing system in accordance with the present invention.

FIG. 1 is a live music performance system 8 including an audio signal processing system 10 in accordance with the present invention. As shown, system 8 includes one or more audio sources 12 and one or more musical instrument digital interface (MIDI) trigger sources 16 connected to signal processing system 10. Audio sources 12 are also connected to the signal processing system 10 through a conventional audio mixer 14 in the illustrated embodiment. Other embodiments of the invention (not shown) do not include mixer 14. Audio sources 12 can be any source of electrical signals representative of audible sound such as guitars, keyboards, or other electric instruments and microphones (for providing vocal sound signals). Alternatively, audio sources 12 can be recorded or stored files of electrical signals that are operated to play back the electrical signals in real time. MIDI trigger sources 16 can be any sources of MIDI protocol electrical trigger signals such as keyboards, drum pads and guitars. Alternatively, trigger sources 16 can be stored files of such trigger signals that are executed to generate the trigger signals. As described in greater detail below, signal processing system 10 includes a wide variety of software sound effects and other plug-ins, software instrument libraries and software vocal libraries. A musician or other operator can use the signal processing system 10 to select and generate sound or "play" any of the instruments or vocals from the libraries in response to the MIDI trigger sources 16. The musician can also select any of the plug-ins and cause the sound of the instruments and/or vocals to be manipulated by the plug-ins. Alternatively or in addition to the playing of instruments and vocals, the musician can select plug-ins that are used to manipulate the sound of the audio sources 12. After they are generated and/or manipulated by the signal processing system 10, the audio signals are outputted to a conventional audio amplifier 18 which drives one or more speakers 20. A listener (not shown) can then hear in real time or substantially real time the live music performance as it is created by the musician.

Figure 2:
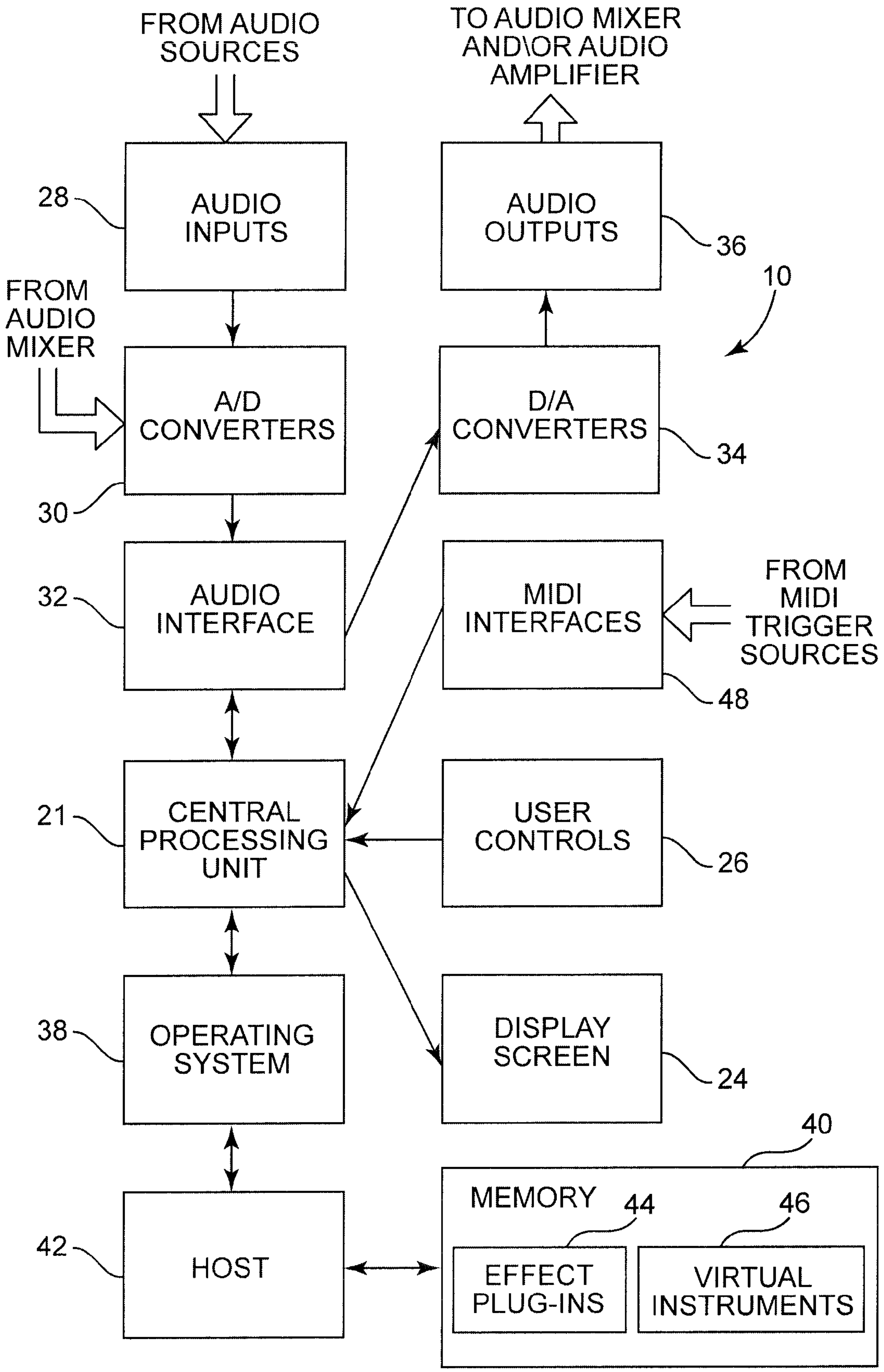
FIG. 2 is a detailed block diagram of one embodiment of the signal processing system shown in FIG. 1.

FIG. 2 is a detailed block diagram of one embodiment of the signal processing system 10. As shown, signal processing system 10 includes a central processing unit (CPU) 21 coupled to a graphic user interface 22 having a display screen 24 and user-actuated controls 26. Analog audio signals from the audio sources (FIG. 1) are inputted to the signal processing system 10 through audio inputs 28 and converted into digital form by A/D (analog-to-digital) converters 30. An audio interface 32 couples the digital audio signals from A/D converter 30 to CPU 21. Although not separately shown, CPU 21 includes memory (e.g., random access memory) for storing data and signals such as the analog audio signals during the processing operations. Processed digital audio output signals produced by CPU 21 are converted to analog form by digital-to-analog (D/A) converter 34 and outputted from the signal processing system 10 through audio outputs 36. As shown, audio interface 32 couples the CPU 21 to the A/D converter 34. CPU 21 is controlled by an operating system 38. Random access memory (RAM) 40 is coupled to the CPU 21 through an audio host 42. As shown, memory 40 includes sound effect plug-ins 44 and libraries of virtual instruments 46. Trigger signals from a MIDI source (FIG. 1) are coupled to the CPU 21 through a MIDI interface 48.

Audio inputs 28 and audio outputs 36 can be conventional analog devices such as commonly-used ¼" balanced or unbalanced jacks. One embodiment of the invention includes an 8-channel audio input 28 and an 8-channel audio output 36, although other embodiments have greater or fewer channels. A/D converters 30 and D/A converters 34 can be conventional devices operating at conventional sampling frequencies. By way of example, converters 30 and 34 can be 16- or 24-bit devices operating at sample frequencies of 41K Hz or higher. Other embodiments of the signal processing system 10 (not shown) do not include A/D converters 30 and/or D/A converters 36, and instead are configured to receive and output digital audio signals. In these embodiments of the invention, the audio inputs 28 and audio outputs 36 can be conventional ADAT or S/PDIF jacks.

Audio interface 32 converts the format of the digital signals provided by A/D converter 30 (or received from digital audio inputs 28 in the embodiments with no built-in A/D converter) to a format suitable for inputting into CPU 21. Similarly, the audio interface 32 converts the format of the digital audio signals outputted from CPU 21 to a format suitable for inputting into D/A converter 34 (or to digital audio inputs 28 in the embodiments with no built-in D/A converter).

CPU 21 includes one or more high speed microprocessors and associated random access memory. The operating system 38 run by CPU 21 can be a commercially-available operating system such as OSX, Windows XP, Vista or Linux. Alternatively, the operating system 38 can be a proprietary system.

Memory 40 is high-capacity, high-speed random access memory (RAM). One embodiment of the invention includes 5 Gb of memory, although other embodiments include greater or lesser amounts. In general, the greater the amount of memory, the greater the number and the higher the quality of the sound effect plug-ins 44 and the virtual instruments 46 that can be stored in the memory 40. Memory 40 can be included within the same housing or enclosure as other components of signal processing system 10, or in a separate enclosure that is connected to the other components of the signal processing system by a conventional interface.

Preferably stored within memory 40 is a large number and wide variety of software plug-ins 44 that can be used by CPU 21 to manipulate the audio signals. By way of example, sound effects plug-ins and sampling sequences can be stored in memory 40. These plug-ins 44 can be commercially available software and/or proprietary software. Similarly, preferred embodiments of the invention include a large number and a wide variety of software virtual instruments 46 that can be used by CPU 21 to generate audio signals in response to MIDI trigger sources. Examples of virtual instruments of these types include vocal and synthetic sounds as well as those producing conventional instrument sounds. The virtual instruments 46 within memory 40 can be commercially available software and/or proprietary software. Although not shown in FIG. 2, preferred embodiments of the signal processing system 10 will include one or more interfaces enabling software to be conveniently and relatively quickly loaded into the memory 40. CD and DVD drives and Firewire, USB and Bluetooth ports are examples of the interfaces that can be included for this purpose.

One or more hosts 42 are included to convert the software plug-ins 44 and instruments 46 in memory 40 to a format suitable for operation by CPU 21. Commercially available hosts 42 such as Real Time Audio Suite (RTAS), Virtual Sound Technology (VST), and Audio Units (AU) that are compatible with commercially available software plug-ins 44 and instruments 46 can be used for this purpose. Alternatively, or in addition to the commercially available hosts 42, one or more proprietary hosts can be used in connection with proprietary software plug-ins 44 and instruments 46.

MIDI interface 48 converts the conventional MIDI protocol trigger signals received from sources such as 16 (FIG. 1) to a format used by CPU 21. Other embodiments of the invention may be configured to receive trigger signals in other protocols (as an alternative and/or in addition to MIDI signals), and these embodiments would include an interface to convert any such trigger signals to the format used by CPU 21.

Display screen 24 can be a conventional LCD or LED device providing text and/or graphical displays. User controls 26 can be buttons, a key pad, a mouse or other structures that are actuated by a user. Display screen 24 and user controls 26 function together as a graphical user interface 22, enabling a musician to easily access and operate all the functions available from signal processing system 10. By way of example, a musician can operate the user interface 22 to select one or more plug-ins 44 and/or one or more virtual instruments 46. The user interface 22 can also be operated to select a processing scheme by which the inputted analog signals, and/or selected virtual instruments 46 will be processed by the plug-ins 44 (and/or combined and/or reprocessed with other analog signals, virtual instruments and/or plug-ins as discussed in greater detail below) to establish a performance arrangement. In one embodiment of the invention the user interface 22 allows users to store selected plug-ins 44, virtual instruments 46 and/or processing schemes. The musician can thereby easily select all the parameters required for a previously established performance arrangement. Stored performance arrangement information can also be presented through the user interface 22 as presets stored during the manufacture of the processing system 10.

In another embodiment of the invention the user interface 22 includes databases of stored information that enable a user to create a certain "sound" without knowing all aspects of the performance arrangement required to achieve that sound. In this embodiment, for example, the user interface 22 can prompt the musician to input (e.g., select from a menu) a desired output sound (e.g., a celebrity musician or band). In a similar manner the user interface 22 can also prompt the musician to input information representative of the analog source they will be using to provide audio input signals (e.g., what guitar is the musician playing). The stored databases will include sufficient information to enable the selection of the plug-ins 44 and/or virtual instruments 46 and the processing schemes that the CPU 21 can implement to achieve a performance arrangement that will produce music signals having the sound desired by the musician.

Figure 3:
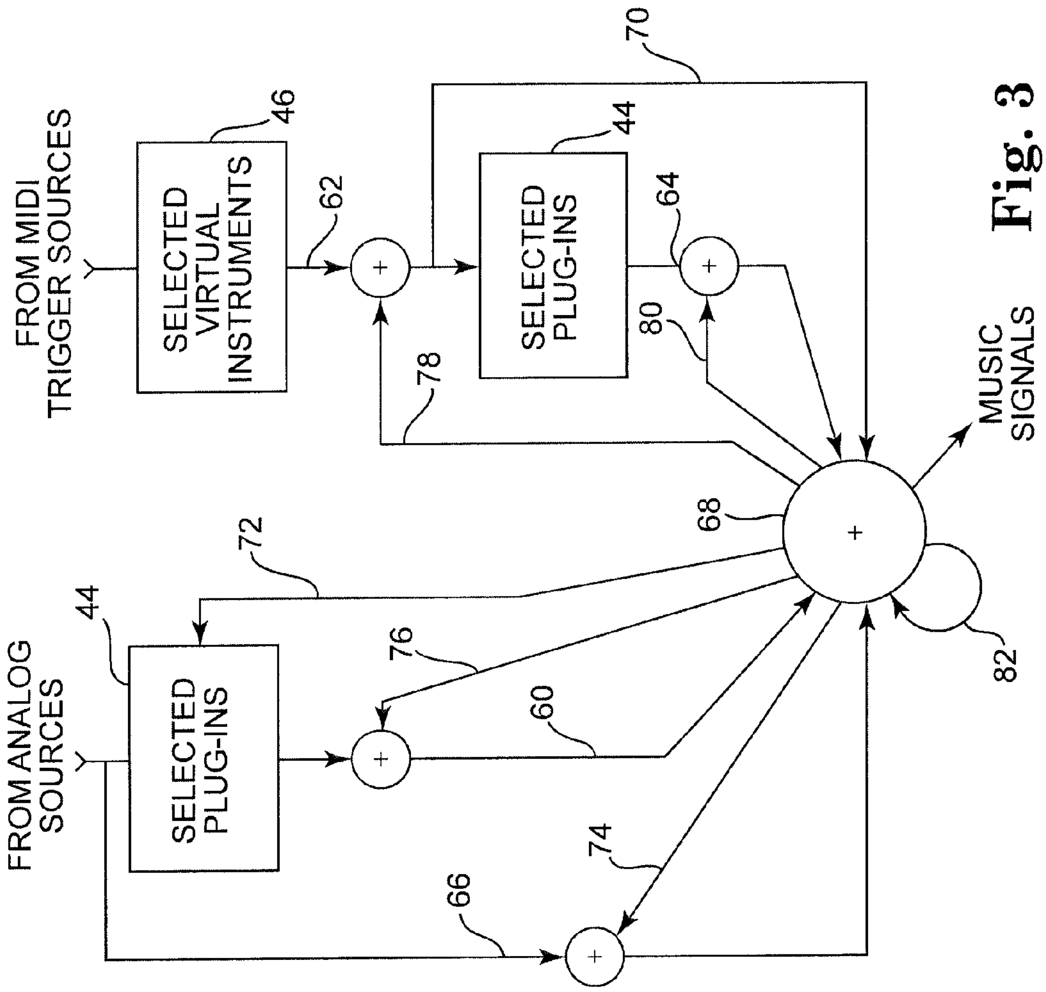
FIG. 3 is a flow diagram illustrating the music processing schemes that can be implemented with the signal processing system shown in FIG. 2.

Signal processing system 10 is used by a musician to generate and/or manipulate sound during the live or real-time performance of music. Audio sounds can be generated and/or manipulated in essentially infinite numbers of ways using system 10. FIG. 3 is a flow diagram illustrating the essentially infinite processing schemes that can be implemented with selected plug-ins 44 and selected virtual instruments 46 to achieve an essentially infinite number of performance arrangements. As indicated by path 60, inputted audio signals can be processed by selected plug-ins 44 to produce manipulated audio signals. Alternatively or in addition to the inputted audio signal processing described above, virtual instrument sound signals can be generated as a function of the received MIDI trigger signals and the selected virtual instruments 46 as represented by path 62. The virtual instrument sound signals can be processed by selected plug-ins 44 to produce manipulated virtual instrument signals represented at path 64. Any or all manipulated audio signals from path 60 can be combined with any or all manipulated virtual instrument signals from path 64, as represented by summing node 68. The "unprocessed" audio signals (e.g., from path 66) and/or the "unprocessed" virtual instrument sound signals (e.g., from paths 62 and 70) can also be combined at node 68, if desired, with any other signals at the node (e.g., with the manipulated audio signals and/or the manipulated virtual instrument signals as described above). The music signals produced by such a first iteration performance arrangement can be outputted from node 68.

At least some embodiments of system 10 also have the capability of further processing any or all of the first iteration music signals available from node 68. As represented by path 72, the music signals from node 68 can be processed by selected plug-ins 44 (that can be the same or different plug-ins than any used in the first iteration) to produce manipulated combined signals. As represented by paths 74, 76, 78 and 80, the music signals from node 68 can also be recombined with the unprocessed audio signals, the manipulated audio signals, the unprocessed virtual instrument sound signals and/or the manipulated virtual instrument sound signals. The music signals produced by such a second iteration performance arrangement can be outputted from node 68.

Still other embodiments of system 10 also have the capability of further processing any or all of the second iteration music signals available from node 68. As indicated by path 82, any or all of the processing scheme components described above can be repeated with any or all of the signals produced by system 10. The music signals produced by any such further iteration performance arrangements can be outputted form node 68.

Still other embodiments of system 10 offer only subsets of the effectively infinite performance arrangements that can be provided by the embodiments described above. For example, one embodiment of the invention allows only the first iteration performance arrangements. Still other embodiments of system 10 offer only other subsets for the performance arrangements described above.

One (but not all) embodiment of signal processing system 10 is a limited-functionality device dedicated to use in live performances. This embodiment does not include components typically found in systems used for music recording applications.

Embodiments of the invention can be implemented using the Rax virtual rack software available from Audiofile Engineering of St. Paul, Minn. In particular, the Rax software can effectively function as the host 42 of the embodiment of the invention illustrated in FIG. 2. A Manual and other technical information describing the Rax software is available on the Audiofile Engineering website (audiofile-engineering.com), and are incorporated herein by reference in their entirety for all purposes. Audiofile Engineering also distributes an audio file editing system known as Wave Editor. The Wave Editor file editing system can be incorporated into signal processing system 10 as a system for processing recorded or stored sound files created using the signal processing system, and/or as a system for implementing the signal processing functionality of system 10. The Wave Editor software is described in the Wave Editor User's Guide available on the Audiofile Engineering website, and in the Foust et al. U.S. Patent Application Publication No. 2008/0041220, both of which documents are incorporated herein by reference in their entirety for all purposes.

An important advantage of signal processing system 10 over currently available systems is the high quality of the sound that is produced by the system. Another important advantage provided by signal processing system 10 is its ease of use. All of the functions of the system 10 can be conveniently accessed by a musician through relatively few layers of menu structure in the user interface 22. Yet another advantage of signal processing system 10 is its relatively compact size. The above-described robust function set of signal processing system 10 is thereby achieved at a relatively inexpensive price.

Although the present invention has been described with reference to preferred embodiments, those skilled in the art will recognize that changes can be made in form and detail without departing from the spirit and scope of the invention.

What is claimed is:

1. A signal processing system for generating and/or manipulating sound in real time, including:

an audio input for receiving an audio signal;

a trigger input for receiving a trigger signal;

an audio output for outputting sound signals;

a memory for storing a plurality of digital files;

a graphical user interface enabling a user to select at least one digital file from the memory and to select a processing scheme;

a digital processor coupled to the audio input, trigger input, memory, audio output, and user interface, the digital processor programmed with an algorithm enabling the digital processor in real time, based on the selected processing scheme, to:

manipulate the audio signal using the at least one digital file to produce a manipulated audio signal;

generate a virtual instrument sound signal using the trigger signal and the at least one digital file;

manipulate the virtual instrument sound signal using the at least one digital file to produce a manipulated virtual instrument signal;

combine the audio signal with the manipulated audio signal, the virtual instrument sound signal, or the manipulated virtual instrument signal to produce a combined signal; and output a music signal to the audio output, the music signal including at least one of the audio signal, the manipulated audio signal, the virtual instrument sound signal, the manipulated virtual instrument signal, or the combined signal.

2. The signal processing system of claim 1, wherein the algorithm further enables the digital processor to manipulate the combined signal to produce a manipulated combined signal, and wherein the music signal includes the manipulated combined signal.

3. The signal processing system of claim 1, wherein the digital files include a plurality of sound effects plug-ins.

4. The signal processing system of claim 1, wherein the digital files include a plurality of virtual instrument libraries.

* * * * *